United States Patent [19]

Hu

[11] Patent Number: 4,471,523
[45] Date of Patent: Sep. 18, 1984

[54] SELF-ALIGNED FIELD IMPLANT FOR OXIDE-ISOLATED CMOS FET

[75] Inventor: Genda J. Hu, Yorktown Heights, N.Y.

[73] Assignee: International Business Machines Corporation, Armonk, N.Y.

[21] Appl. No.: 490,766

[22] Filed: May 2, 1983

[51] Int. Cl.³ .......................................... H01L 21/265
[52] U.S. Cl. .................................. 29/571; 29/576 B; 29/578; 148/1.5; 148/187
[58] Field of Search ...................... 29/571, 576 B, 578; 148/187, 1.5

[56] References Cited

U.S. PATENT DOCUMENTS

| | | | |
|---|---|---|---|
| 3,986,896 | 10/1976 | Ueno et al. | 148/187 X |
| 4,135,955 | 1/1979 | Gasner et al. | 148/187 |
| 4,217,149 | 8/1980 | Sawazaki | 148/1.5 |
| 4,268,321 | 5/1981 | Meguro | 148/1.5 |
| 4,277,291 | 7/1981 | Cerofolini | 148/1.5 |
| 4,282,648 | 8/1981 | Yu et al. | 29/576 |
| 4,313,768 | 2/1982 | Sanders | 29/576 B |
| 4,374,700 | 2/1983 | Scott et al. | 29/571 X |
| 4,385,947 | 5/1983 | Halfacre et al. | 148/187 |
| 4,411,058 | 10/1983 | Chen | 29/571 |
| 4,412,375 | 11/1983 | Matthews | 29/571 |

Primary Examiner—G. Ozaki
Attorney, Agent, or Firm—Jackson E. Stanland

[57] ABSTRACT

A process for making an integrated structure comprised of complementary MOS devices is described, where electrical isolation is provided by recessed field oxide regions and by field isolation implant regions. Starting with a single conductivity type semiconductor layer, such as P- type silicon, a first masking step is used to produce an N- type well therein. After this, a layer of silicon or silicide is formed through the same mask. In a second masking step, openings are made for the field isolation implant regions. The edge of the silicon or silicide layer determines the edge of the field isolation implant, which is therefore self-aligned to the edge of the well. This same mask is later used to determine the locations of the recessed oxide isolation regions. Subsequent masking steps are used to form polysilicon gate electrodes, source and drain regions of the active devices, contact holes and contact metal and interconnects. A high density structure is provided without an extra masking step, and the conductivity levels of the well and the field isolation implants can be separately established. No additional masking steps are required for adjusting the threshold voltages of the P and N channel devices.

18 Claims, 20 Drawing Figures

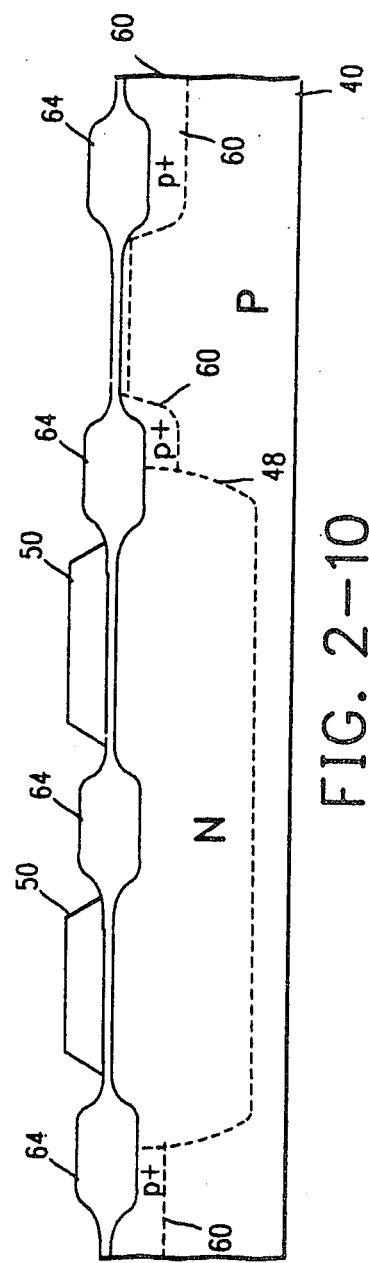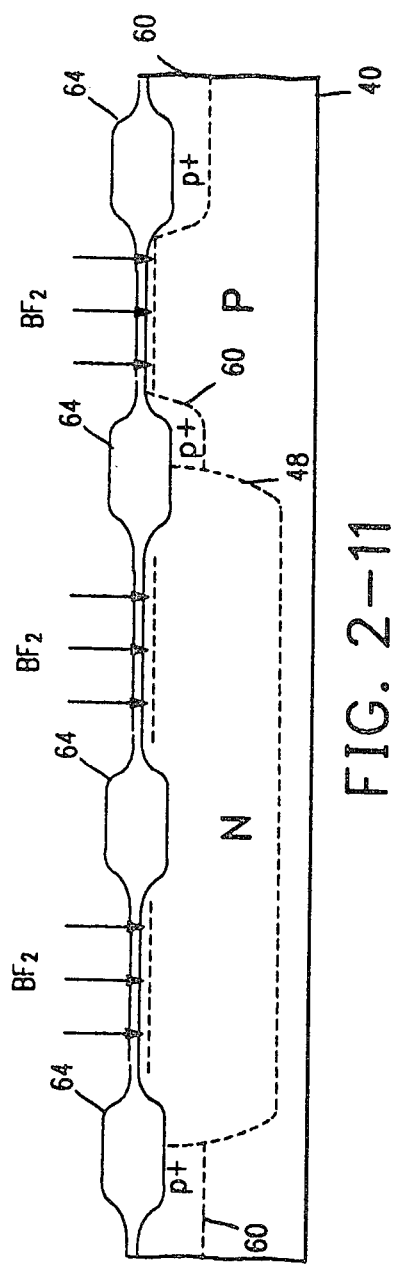
FIG. 2-10
FIG. 2-11

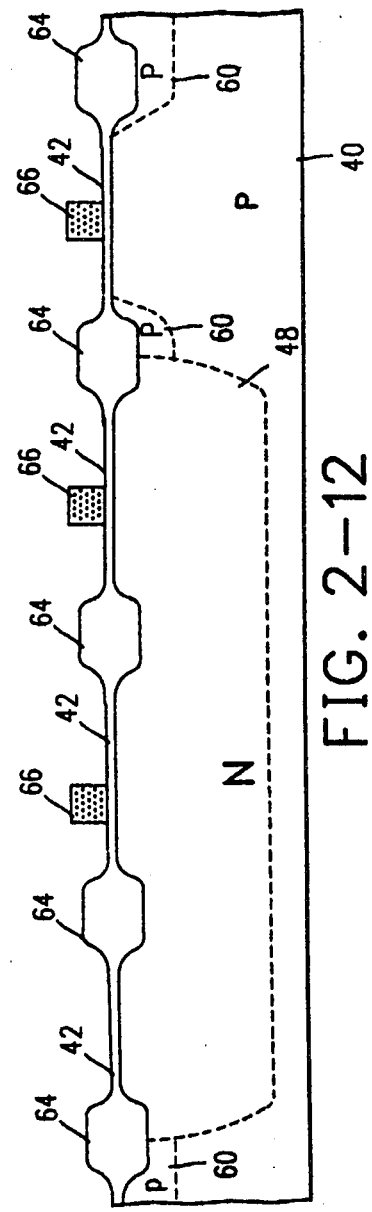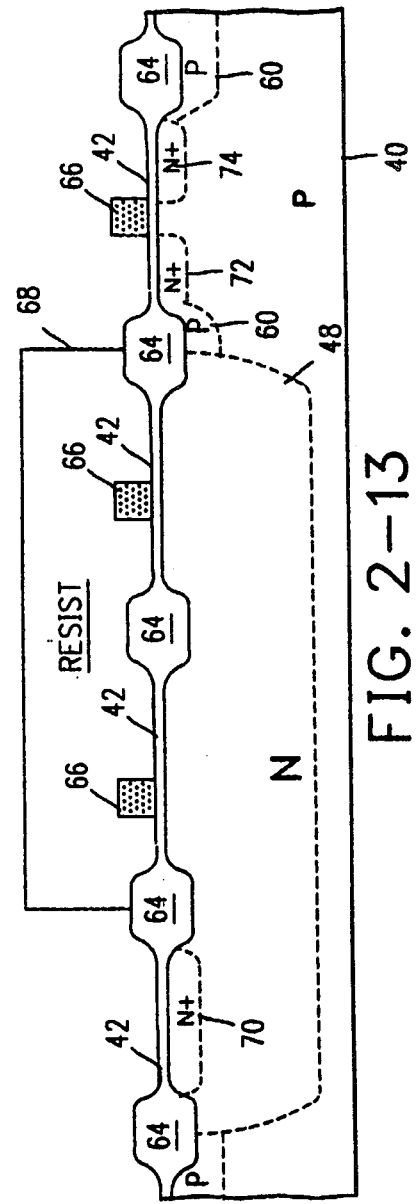
FIG. 2-12
FIG. 2-13

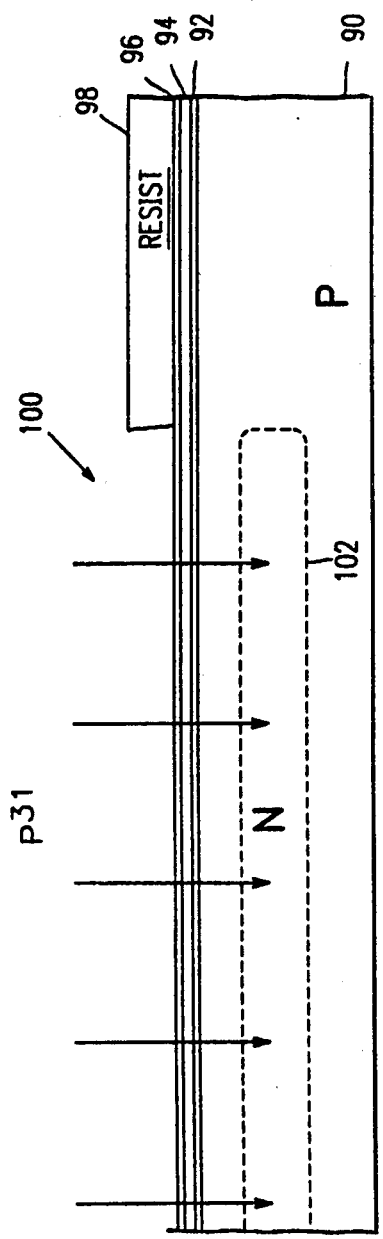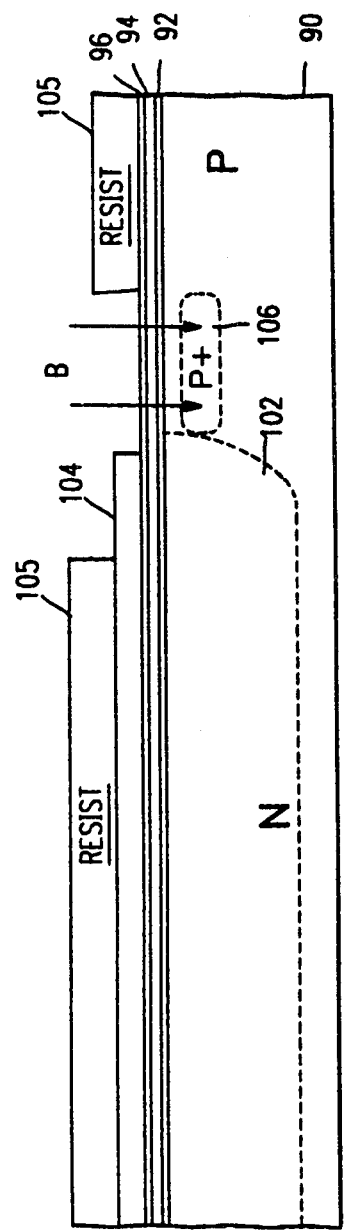

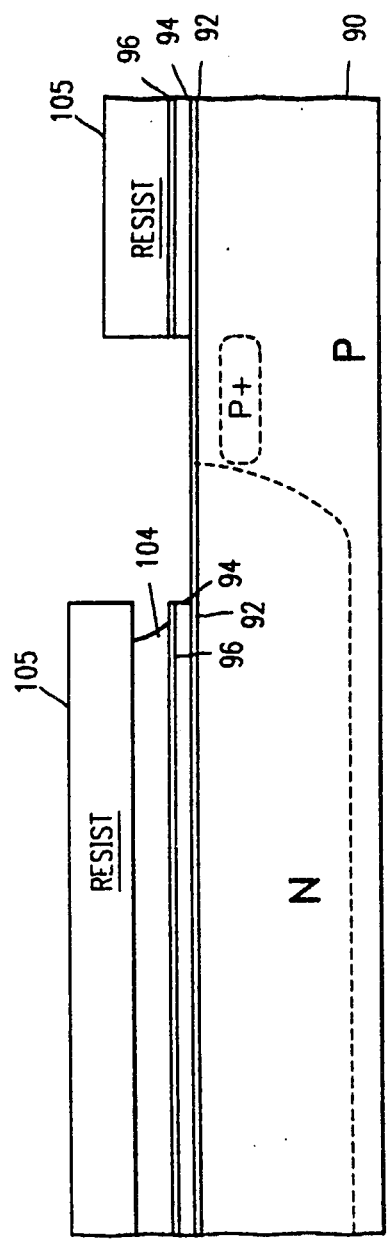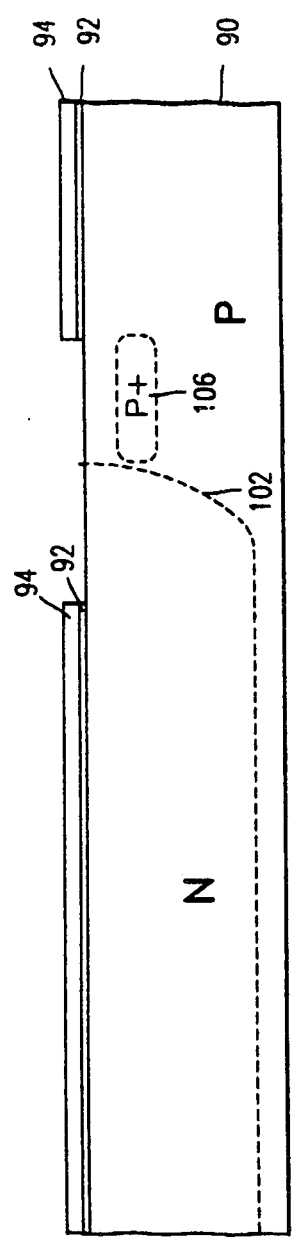

SELF-ALIGNED FIELD IMPLANT FOR OXIDE-ISOLATED CMOS FET

DESCRIPTION

1. Field of the Invention

This invention relates to a technique for producing a complementary MOS (CMOS) structure using recessed oxide regions and highly doped n and p regions to provide isolation, and more particularly to an improved process in which the highly doped regions are self-aligned to the edges of wells produced in a semiconductor wafer containing the CMOS structure.

2. Background Art

Complementary MOS circuits are circuits which generally employ both N and P channel devices in the same integrated structure. To fabricate these structures a semiconductor wafer of a first conductivity type has produced therein a well, or pocket, of the opposite conductivity type. MOS devices are produced in the well and outside of the well, and have to be electrically isolated from one another. These N and P channel devices switch to the on-condition for different polarities of the input signals. In a complementary structure, both P and N channel devices are used in tandem in a circuit (such as an inverter) in which the inverter consumes power only when it switches. When signals are to be transferred from one integrated circuit chip to another, the output drivers of the first chip must provide large current impulses to the chip which is being driven.

In order to minimize continuous power dissipation by the output drivers, it is important to have power consumed only during switching. The tandem design technique uses complementary devices in an inverter circuit to achieve this goal.

As the packing density of integrated circuits is increased, greater alignment accuracy is required when making the devices in the circuit to prevent electrical shorts between the devices. In turn, this requires smaller tolerances in the masks and in the alignment steps wherein the masks are aligned with respect to one another. These alignment problems become particularly acute in the fabrication of high density complementary MOS circuits.

In CMOS structures, a single conductivity semiconductor wafer is typically ion implanted to produce a well therein of opposite conductivity type. At least one MOS device is produced in the well area of the semiconductor wafer, while the opposite type of MOS device is produced outside the well area. To provide isolation between the devices in the well area and those outside the well area, several approaches have been used. In one of these, guard band rings of high conductivity regions were used to enclose each of the active MOS devices to provide reverse biased P-N junctions. However, to improve density that approach has been largely replaced by an oxide isolation technique, wherein thick oxide regions, fully or partially buried in the semiconductor wafer, are used to provide isolation between adjacent MOS devices. An example of such an approach is described by A. Aitken et al "A Fully Plasma Etched-Ion Implanted CMOS Process", which appeared in IEDM, pages 209–213 (1976).

In addition to the thick field oxide, it is desirable to use P+ and N+ regions, termed field implants or field isolation implants, buried beneath the thick oxide formed in the semiconductor wafer for the active devices. These high conductivity P and N type regions provide additional isolation between adjacent devices, and between the devices and the wells, or pockets.

The field isolation implants are generally made in a separate ion implantation step than that used to create the wells. Consequently, an additional masking level is required and there is a tolerance consideration. Furthermore, this approach requires a difficult double-resist technique. This becomes particularly important if the field isolation implant is to be contiguous with and outside the edge of the well. In general, it is desirable that the field isolation implant be aligned with the edge of the well, and not extend beneath the thick buried oxide to a location within the well. If the field isolation implant extends into the well area, there can be an electrical shorting problem. Consequently, approaches such as that taught by John Chen, "Quadruple-Well CMOS-A VLSI Technology," IEDM, pages 791–792 (1982), are described.

In the approach of Chen, CMOS structures are fabricated having four wells. Two of the wells are relatively deep wells for N and P- channels active devices, while the other two wells are shallow wells located under thick field oxide. The shallow wells provide channel stops for both types of devices, and in that manner provide electrical isolation among similar devices and also suppress lateral bipolar action between devices of the opposite polarity. The boundaries beneath the deep and shallow wells are self-aligned with the edges of the field oxide.

While the approach of Chen offers self-alignment, it has disadvantages. For example, only one device can be made in each of the wells, rather than a plurality of devices. Further, the deep wells and shallow wells are formed in the same ion implant step, and therefore the conductivity levels in the wells cannot be tailored for particular purposes. For example, it is desirable that the conductivity of the wall be less than the conductivity of the field isolation implants, but this is not possible in the technique of Chen. Also, the deep wells of Chen are heavily doped which impacts MOS device performance. On the other hand, the doping levels of the isolation implants in Chen are not as high as is desirable to provide maximum isolation. Thus, while a single masking step and self-alignment is provided, it is at the expense of compromising the doping level in the deep wells versus the doping level in the shallow wells (isolation implants). For Chen to provide separate ion implantation steps for the isolation field implants and for the deep wells would require an additional masking step, which in turn would produce further alignment and tolerance problems. Also, Chen may not be able to easily use buried oxide regions for electrical isolation, as this may destroy the shallow well isolation implants. Recessed oxide is generally preferrable in manufacturing processes as this provides a more favorable (flat) topography for resist patterning.

As will be apparent later, the present invention provides self-alignment of the field isolation implant with the edge of the well and does it in such a manner that the doping levels in the field isolation implants and in the wells can be individually tailored. The ion implantation steps for the well and the field isolation implants are separate, but these different regions are produced in such a manner to provide a self-aligned structure. In this structure recessed oxide regions are provided without losing the field isolation implants.

As other features of distinction with respect to Chen, the technique of the present invention can be accomplished by forming the field isolation oxide after making the wells for the active devices. In Chen, the field oxide must be formed prior to implanting the deep wells. Still further, Chen uses Al for lift-off, which cannot be used in processes where subsequent steps require temperatures in excess of about 400° C. In contrast with this, the technique of the present invention uses polysilicon or silicides to enable high temperature processing steps to be done without adverse effects.

The technique described by Ohzone et al in IEEE Trans. on Electron Devices, Vol. ED-27, No. 9, page 1789, Sept. 1980, produces field oxides and high conductivity regions for isolation (FIG. 1). This technique is representative of the approach where the active device wells and the isolation field implants are produced by two separate ion implantation steps.

In the technique of Ohzone et al, two masks are used involving two levels of resist, which is often difficult. Additionally, there is no self-alignment in the technique described in this reference.

In the Aitken et al reference mentioned previously, lateral diffusion of the wells is relied upon to produce a doped region under the thick isolation oxide. These doped regions are, for example, the P− regions shown in FIG. 1 thereof. Thus, this reference is somewhat similar to the aforementioned Chen reference where a single implantation step is used to produce both the wells and the field isolation implants. However, it is not possible to separately adjust the concentration levels in the well and in the field isolation implant, and therefore the device suffers from the same problems described with respect to the Chen reference.

Accordingly, it is a primary object of the present invention to provide an improved technique for producing CMOS structures where the field isolation implants are self-aligned to the edges of the wells in which the active devices are formed.

It is another object of this invention to provide a method for fabricating CMOS structures utilizing isolation oxides and field isolation implants self-aligned to the wells in which active devices are formed, in a manner providing process simplicity.

It is another object of the present invention to provide a technique for self-alignment of field isolation implants to the edges of wells in which active devices are formed in CMOS structures, where a minimum number of processing masks is required.

It is a further object of the present invention to provide an improved process for making CMOS structures in which the field isolation implants are self-aligned to the edges of the wells in which active devices are created, and which allows more than one MOS device to be built in each well.

It is another object of this invention to provide the improved process of the previous paragraph, wherein the required number of electrical contacts to the wells is greatly reduced.

It is a still further object of the present invention to provide a fabrication process of the type described in the preceeding paragraph, and in which a masking step is eliminated for the adjustment of the threshold voltages of the N and P channel devices.

It is a still further object of the present invention to provide an improved process for making CMOS structures in which improved chip density is obtained.

It is another object of the present invention to provide a technique for fabricating CMOS structures utilizing optimized doping of isolation field implants in both N and P regions of the structure, without requiring additional masking steps.

It is another object of this invention to provide a process for making CMOS structures in a simple semiconductor wafer of a first conductivity type having therein a well of opposite conductivity type using both recessed oxide regions and highly doped regions for electrical isolation, wherein said highly doped regions are self aligned to the well.

It is another object of this invention to provide the process of the immediately preceding object wherein said well and said highly doped regions have independently determined conductivity levels.

DISCLOSURE OF THE INVENTION

An improved method for forming integrated complementary MOS structures is described using a minimum number of masking steps and self-alignment to achieve improved chip density and to eliminate masking steps required for adjusting threshold voltages for both P and N channel devices. Electrical isolation is provided by buried field oxide regions and by high conductivity field implant regions located below the buried oxide regions.

In a semiconductor wafer of a single conductivity type, for example, P-type silicon, a first masking level is used to define window(s) for creating at least one well of opposite conductivity type in the semiconductor wafer. Ion implantation is then used to form the opposite conductivity type wells through these windows in the mask. After this, a layer of silicon or silicide (masking layer) is formed on the surface of the semiconductor wafer using the same mask openings. The mask is then lifted off and a second masking layer provided over the silicon (or silicide) masking layer, in such a manner that openings to the underlying semiconductor layer are formed. The edges of the deposited silicon (or silicide) layer form the edges of this mask and are used to define the edges for the field isolation implants. The openings in the silicon (or silicide) layer also aid in defining regions where the buried isolation oxide will be formed.

Ion implantation is then used to form the field isolation implants, which are self-aligned to the edge of the well, since the deposited silicon or silicide layer was formed through the same mask as that used to provide the well. After this, the steps to complete the structure are not critical to the invention and many variations can be used. These additional steps involve the provision of a polysilicon gate electrode, implantation of source and drain regions in the semiconductor wafer, formation of contact holes, and the subsequent formation of metal contacts and metal interconnects.

In the subject process, separate ion implantation steps are used to form the well regions and the field isolation implant regions. This means that the conductivity levels in these regions can be separately determined to provide maximum electrical isolation, and to prevent problems such as latchup. This contrasts with the prior art, where self-alignment is achieved only be using the same ion implantation step to form both the well regions and the field isolation regions (for example, see aforementioned Chen reference).

The present invention is characterized by process steps in which the mask used to define the well regions is also used for the formation of an overlying masking layer, which layer becomes part of the mask for the formation of recessed oxide isolation regions and for the field isolation implants. This provides self-alignment of the field isolation implants to the edges of the wells.

The invention is further characterized by a fabrication process in which the conductivity levels of the wells and the field isolation implants can be independently controlled and in which the field isolation implants are not impaired when the recessed oxide regions are subsequently formed over them. Another feature of this invention is that the process steps allow more than one active device to be formed in each of the wells, thus improving density and minimizing the required number of contacts to the wells.

These and other objects, features, and advantages will be apparent from the following more particular description of the preferred embodiments.

BRIEF DESCRIPTION OF THE DRAWINGS

FIGS. 2-1 through 2-15 are side views illustrating a fabrication process for producing the CMOS structure of FIG. 1.

FIGS. 3-1 through 3-4 are side views illustrating an alternative process for producing the CMOS structure of FIG. 1.

BEST MODE FOR CARRYING OUT THE INVENTION

The fabrication process of this invention is used to produce integrated CMOS structures comprising N channel and P channel devices in a single semiconductor wafer, in a manner to provide numerous advantages. Electrical isolation is provided by field oxide regions and by field isolation implants located below the field oxide regions, where the field isolation implants are self-aligned to the edges of wells in which active devices are produced. A minimum number of masking steps is used to produce the structure, and the conductivity levels of the wells and the field isolation implants are separately controllable.

Figure 1:
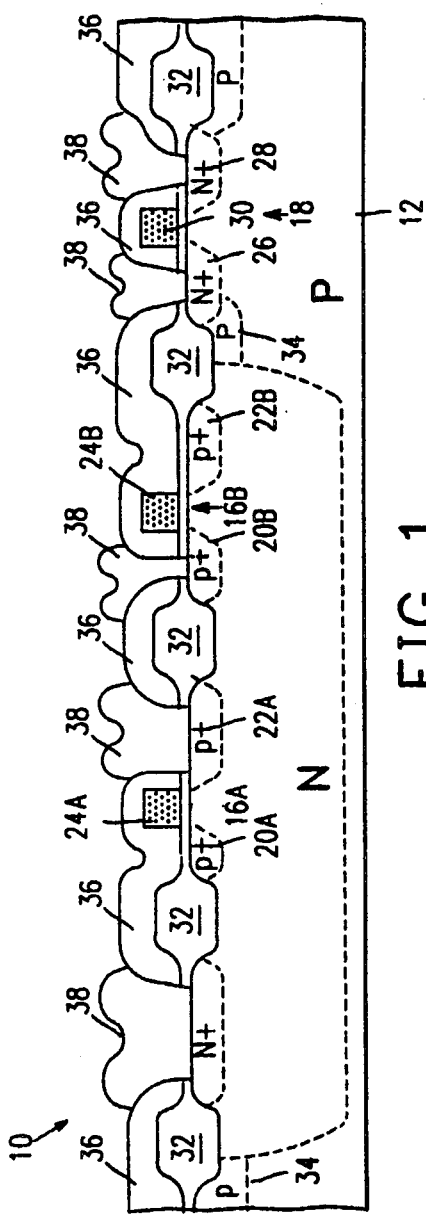
FIG. 1 is a side view of an oxide-isolated CMOS structure in which field isolation implants are self-aligned to the edges of the N- type well, and are located beneath the isolation oxide regions.

FIG. 1 is a side view of a CMOS structure, and represents the type of circuit to be made by the present invention. Structure 10 is comprised of a single semiconductor wafer 12, such as silicon, having a single conductivity type (in this illustration, P- type). An N- type well 14, or pocket, is formed in wafer 12 by ion implantation, and is used to provide P channel devices 16A and 16B. N- channel devices, such as device 18, are formed outside well 14. Device 16A is comprised of source and drain regions 20A, 22A and a polysilicon gate electrode 24A, while device 16B is comprised of source and drain regions 20B, 22B, and polysilicon gate electrode 24B. N- channel device 18 is comprised of source and drain regions 26, 28, and polysilicon gate electrode 30.

Electrical isolation between devices 16A, 16B and 18 is provided by the recessed oxide regions 32 and by the isolation field implants 34, which are located beneath oxide regions 32 and are self-aligned to the edges of well 14. An insulation layer 36, such as $SiO_2$, is located over the recessed field oxide regions 32, and is used to provide insulation between the polysilicon gate electrodes 24A, 24B, 30 and the metal layer 38 to the source and drain regions and to the well region 14.

Figures 1, 2:
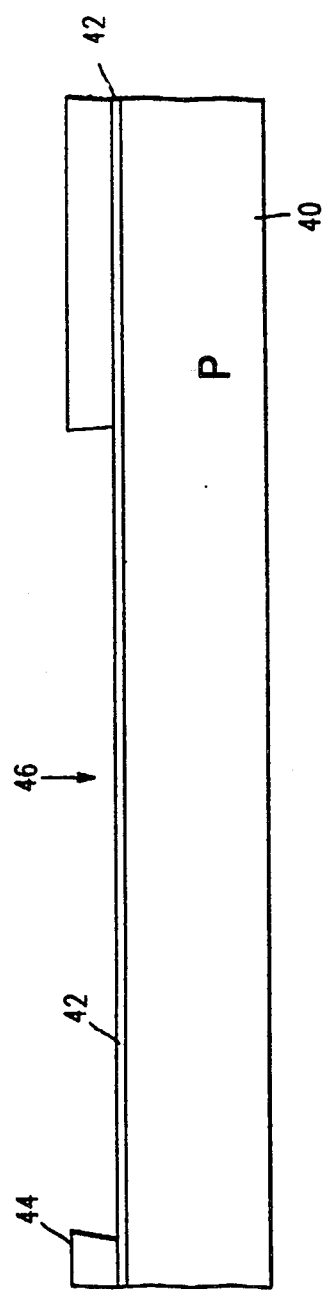
Figure 2:
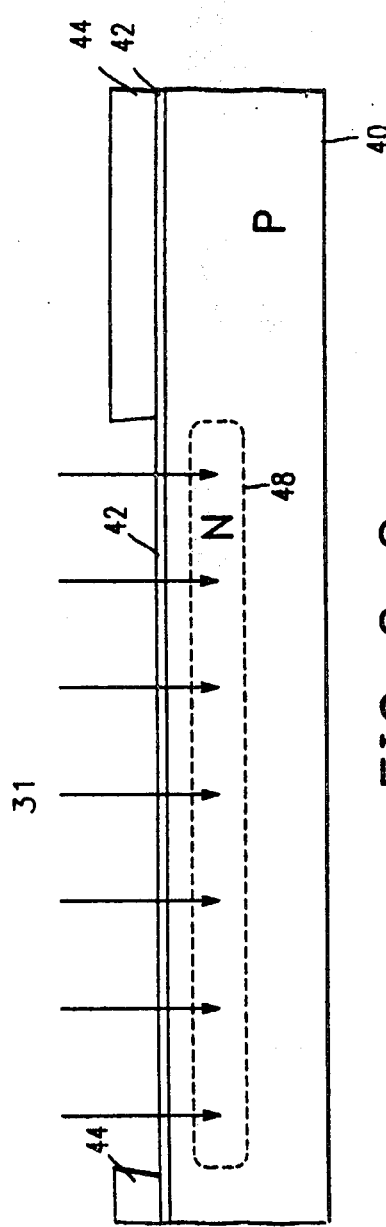

FIGS. 2-1 Through 2.15

These FIGS. illustrate a process for providing the structure of FIG. 1, using a minimum number of masking steps and providing improved density of CMOS structures. In FIG. 2.1, a semiconductor layer 40 is provided, having a single conductivity type. For example, semiconductor 40 can be a silicon wafer of P-type conductivity, as illustrated. A thin layer 42 of a passivating insulator, such as $SiO_2$, is formed over the entire silicon wafer 40. This oxide is easily formed on silicon layer 40 by placing layer 40 in a furnace and heating to approximately 800°–1000° C. The thickness of layer 42 is typically 200–1000Å. If layer 42 is too thick, it will prevent later ion implantation of silicon wafer 40 and will also impact later oxidation to produce the recessed oxide isolation regions. On the other hand, if layer 42 is too thin, it will not provide sufficient protection of the silicon surface.

In a first masking step, a layer 44 of resist is spun onto oxide layer 42 and is exposed and developed to provide a masking level. The window 46 in a masking layer 44 defines the location of a N- type well to be formed in silicon layer 40.

FIG. 2-2 illustrates the formation of a N- type well 48 by implantation of, for example, $P^{31}$ ions into wafer 40. The well is typically about 5–10 micrometers wide, or wider. Typical ion implantation dosages are in the order of $10^{12}$ ions/cm$^2$, at an energy from about 100 KeV to about 1000 KeV.

Of course, it will be recognized by those of skill in the art that these parameters can be varied to provide different wells. For example, while the surface area of layer 40 is not implanted in the illustration of FIG. 2-2, it could be surface implanted. However, it is often more desirable to provide a deep implantation and then to spread the well by a drive-in step.

After the well 48 is implanted, a layer of silicon 50 is deposited, as by evaporation, using masking layer 44. This layer can be polycrystalline or amorphous silicon, or it can be a layer of silicide, such as tungsten silicide. Its function will be as a masking layer, which will be more apparent later. The important feature is that it is formed through masking level 44, and will therefore be self-aligned with the edges of well 48.

After formation of layer 50, resist 44 is dissolved with an appropriate solvent, which removes the portions of layer 50 overlying the resist. Then, a nitride layer 52 is formed over layer 50, and over exposed portions of oxide layer 42. This nitride layer is approximately 1000Å thick, and will later be used as a mask for oxidation to produce the recessed oxide isolation regions. It is also used to protect the underlying silicon or silicide layer 50 from oxidation. If the layer 50 were oxidized, it would have the same etch rate as an oxide layer, and it would not be possible to provide differential etching to remove only layer 50 in a later processing step.

Figures 2, 3:
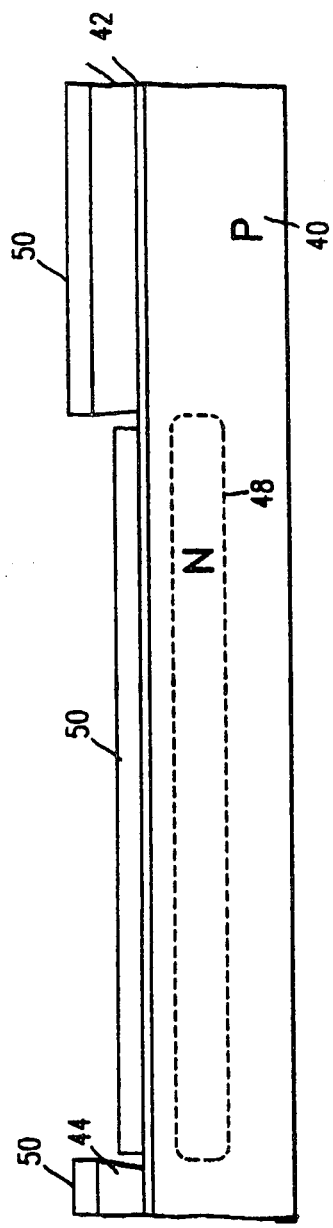
Figures 2, 3, 4:
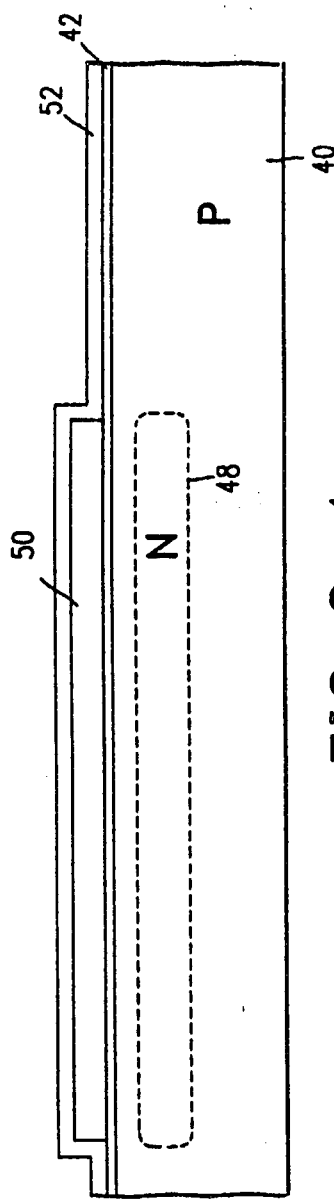
Figures 2, 3, 4, 5:
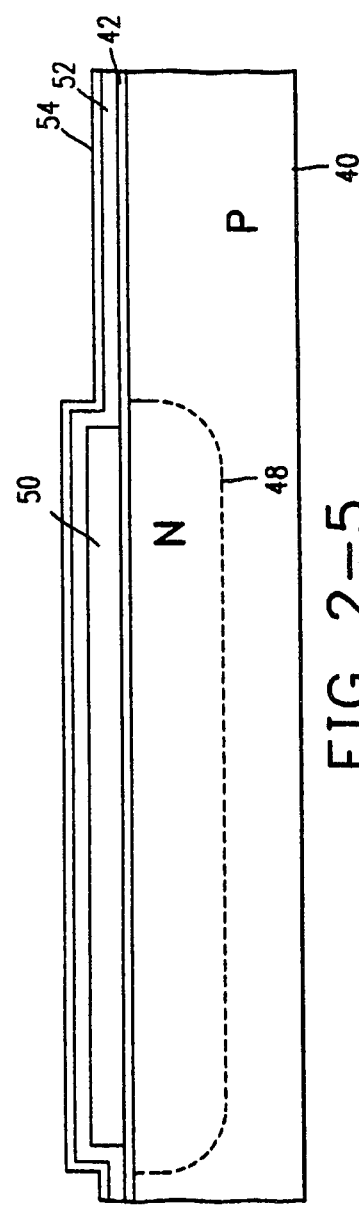
Figures 2, 3, 4, 5, 6:
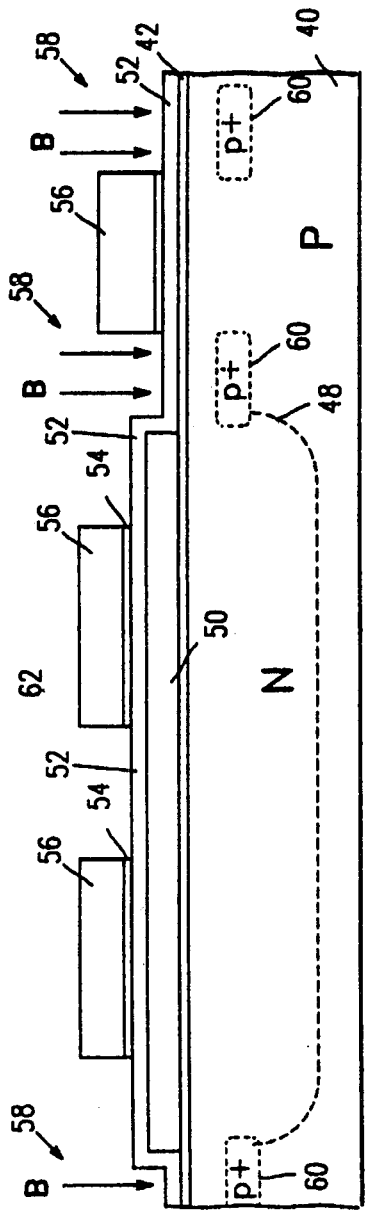
Figures 2, 3, 4, 5, 6, 7:
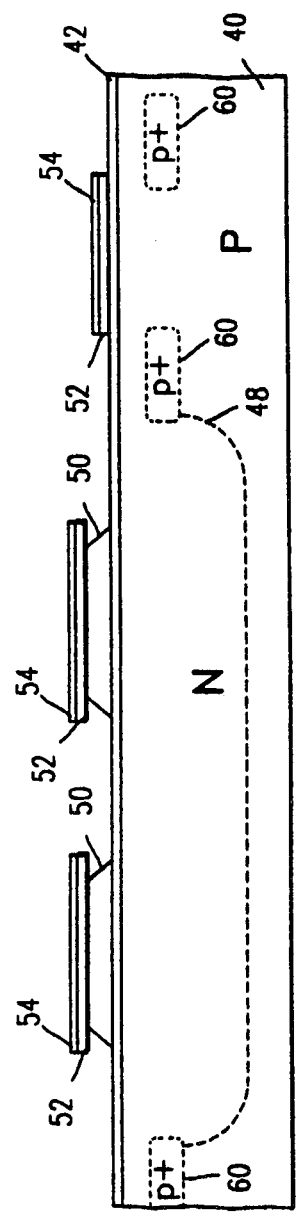
Figures 2, 3, 4, 5, 6, 7, 8:
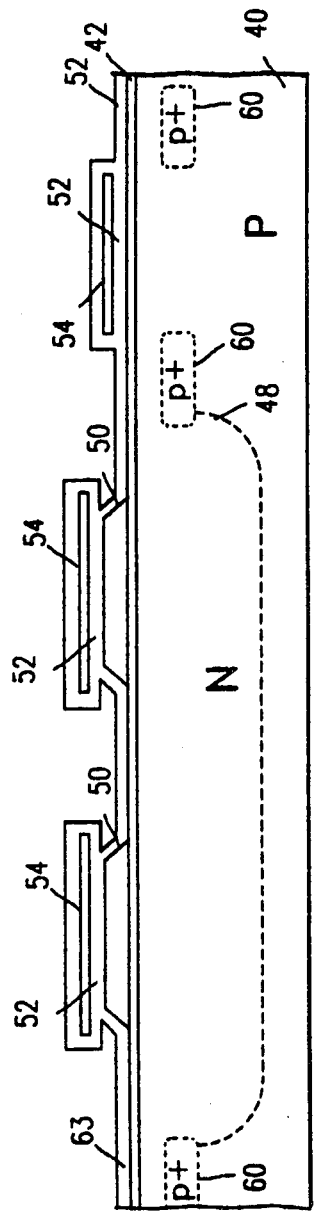
Figures 2, 3, 4, 5, 6, 7, 8, 9:
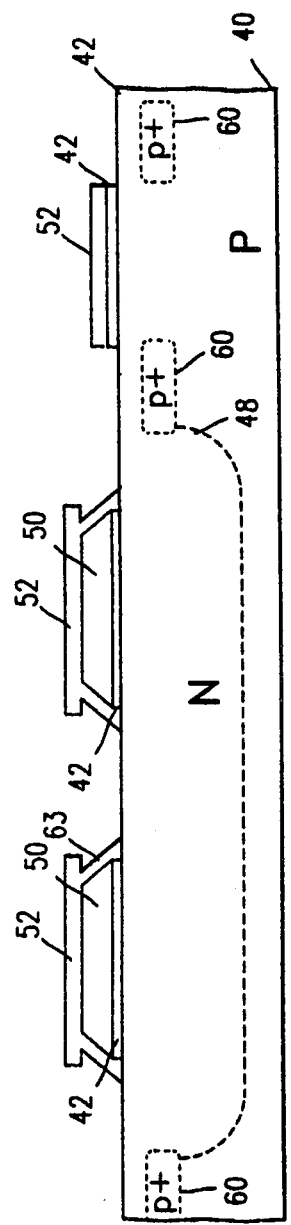
Figures 2, 3, 4, 5, 6, 7, 8, 9, 10, 11, 12, 13, 14:
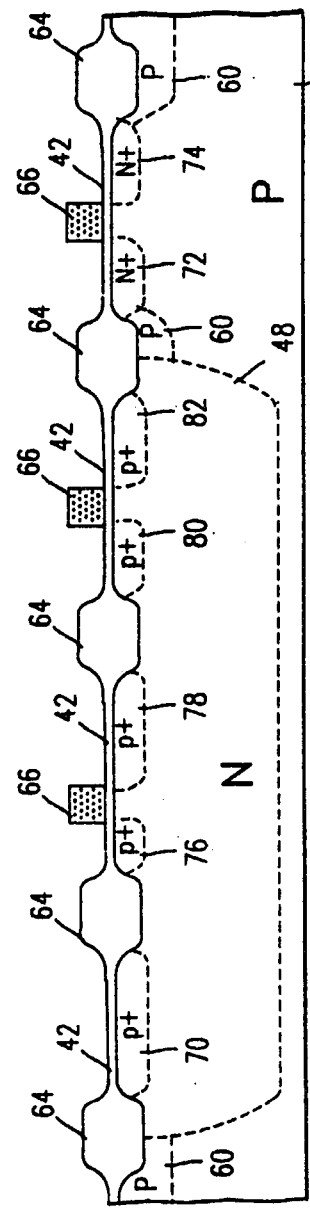
Figures 2, 3, 4, 5, 6, 7, 8, 9, 10, 11, 12, 13, 14, 15:
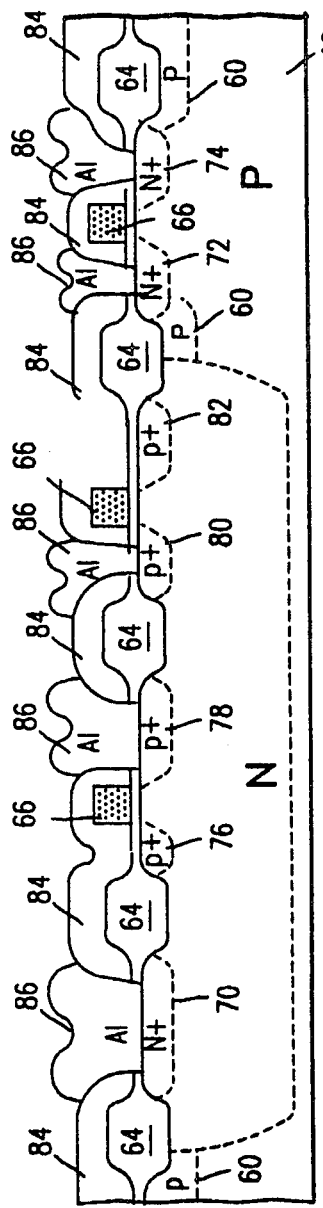

The structure of FIG. 2-4 is then subjected to a drive-in step in which the structure is heated in a neutral ambient (such as $Ar/N_2$) to a temperature which will cause diffusion of the N dopant to the surface of semiconductor wafer 40. This is used to complete the well formation as indicated in FIG. 2-5. Of course, there will be some small spreading of the well in a lateral direction, but this can be controlled by the temperature and length of time in the drive-in step. Temperatures typically in excess of about 1000° C. are used for this drive-in step, but these can be varied in accordance with principles well known in the art.

In FIG. 2-5, nitride layer 52 is covered with an oxide layer 54 of approximately 300Å thickness. This oxide layer will later be used as a mask when portions of nitride layer 52 are removed.

A second masking step is then undertaken, using a resist layer 56 which is patterned as shown in FIG. 2-6. This masking step is not critical, and is used to form windows 58 for implantation to produce field isolation implant regions 60 and for defining locations where the field isolation oxide is to be formed. Windows 62 are also provided for later formation of recessed isolation oxide regions in the well area. The portions of oxide layer 54 located in the windows 58 and 62 are etched away prior to the ion implantation step used to produce the field implant regions 60.

Ions such as boron ions ($B^{11}$) are then implanted into wafer 40 to provide the field isolation implant regions 60. During this implantation step, an edge of the implant region 60 is determined by the edge of the silicon or silicide layer 50. Since the edge of layer 50 was determined by the mask 44 used to implant the well, field implant region 60 will be self-aligned to the well. In FIG. 2-6, region 60 extends a short distance into the well 48, because of the spread of the well during drive-in as illustrated in FIG. 2-5. However, this small amount of overlap can be adjusted, and will not significantly impair the isolation properties of the field implants 60.

As is apparent in FIG. 2-6, field implant regions 60 are formed below the surface of semiconductor 40. This is important because the recessed field oxide regions will also be formed through windows 58. Since the recessed oxide regions will strongly attract boron ions, the field implant regions 60 would be lost if they were too close to the surface of semiconductor 40. For this reason, field implants 60 are sufficiently deep that they are not destroyed by the oxide isolation regions which are later formed over them. This is another advantage of a separate ion implantation step to provide the field implant region 60.

After boron ion implantation, resist layer 56 is removed and the underlying oxide layer 54 is used as a mask to etch away exposed nitride layer portions 52. After the nitride layer is etched, portions of layer 50 located outside layer 54 are etched. Phosphoric acid etchant ($H_3PO_4$) is used to remove the exposed portions of nitride layer 52. This etchant will not attack $SiO_2$ layers 42 and 54. After this, a gas mixture of $CF_4$ and $O_2$ is used to etch layer 50 where it is exposed in windows 58 and 62. This is an isotropic etch, and will produce an undercut as indicated in FIG. 2-7.

In FIG. 2-8, another layer 63 of silicon nitride is deposited by chemical vapor deposition in order to protect the exposed edges of silicon layer 50. This prevents the silicon layer 50 from being oxidized, so that it can be removed in a later processing step without removing the recessed isolation oxide regions.

Nitride layer 63 is then subjected to reactive ion etching, which is a directional etching technique. In this manner, a vertical etch will be provided in order to remove nitride layer 63 in those portions thereof which are on oxide layer 42 and over oxide layer 54. After this, the structure is subjected to a dip in HF to remove the remaining portions of oxide layer 54, and those portions of oxide layer 42 which are not beneath the silicon layer 50. This leaves the structure shown in FIG. 2-9.

Using nitride layers 52 and 63 as a mask, recessed oxide isolation regions 64 are grown. This is accomplished by heating the entire structure in an oxygen ambient to approximately 950° C. for about three hours. This oxide growth step produces oxide regions 64 which extend into silicon wafer 40 and into the field isolation implants 60. The oxide will attract boron ions from the implants 60 and will repel phosphorus ions back into the N well 48. This means that the field implant region will be closely aligned with the edge of the well 48. It is also the reason why heavy doping is used to produce the field implant regions 60, since it is known that some boron atoms will be lost into oxide region 64.

During the formation of the recessed oxide region 64, silicon layers 50 were protected by the surrounding nitride layers. Also, the silicon nitride 52 and 63 serve as a mask when forming oxide regions 64. In the prior art, another mask would be required for implantation of the field isolation regions. This additional mask would require a critical alignment.

The formation of the oxide isolation regions after the implantation steps is another distinction from the aforementioned Chen reference, where the oxide isolation regions are produced early in the process by a first masking step, while two additional and later masking steps are used to produce the field isolation implants. Still further, Chen does not use recessed oxide regions that extend deeply into the silicon wafer. Additionally, the present invention uses a layer 50 to determine the edges of the field implants 60 as well as to assist in defining the regions for growth of the isolation oxide 64. A layer having the effect and function of layer 50 is not used in Chen.

The nitride layers 52 and 63 are then etched away using phosphoric acid. This produces the structure of FIG. 2-10.

Silicon layer 50 is then etched away by a plasma etching step using a gas of $CF_4$ and oxygen. This produces the structure of FIG. 2-11. However, the structure of FIG. 2-10 can be used as a "free" mask for a channel implant. Using the silicon layers 50, a channel implant can be done in the P region. When silicon layer 50 is removed, a common channel implant (illustrated by the $BF_2$ ions in FIG. 2-11) can be performed in both the N and P regions at the same time. Consequently, the total implantation dose in one region will be different than in the other region. By properly choosing the implant dose and species, it is possible to obtain the desired threshold voltages for both the P and N channel devices for any selected gate material without requiring an extra masking step.

The present invention is contained in the processing steps described so far. The rest of the fabrication process to produce the structure of FIG. 1 is well known in the art, and can include many different variations. The remaining process steps include the provision of polysilicon gate electrodes, source and drain regions in the well and in the surrounding regions of the silicon wafer 40, provision of insulating layers and via holes therein, and application of metal contacts and interconnect lines. For example, FIG. 2-12 shows a structure in which a masking step was used to produce the polysilicon gate electrodes 66. These electrodes are insulated from the semiconductor wafer 40 by the thin oxide layer 42.

In FIG. 2-13, a layer 68 of resist is used to protect regions of the well 48 where P- channel devices are to be formed. Resist layer 68 is a masking layer for the formation of well contact 70 and source and drain regions 72 and 74. The N+ regions are produced by ion implantation with, for example, As ions, as indicated by the arrows in FIG. 2-13.

Resist layer 68 is then removed and another resist layer (not shown) is applied to block the N+ regions. This new resist layer is used as a mask in forming the P+ source and drain regions 76, 78, 80, and 82.

A layer 84 of $SiO_2$ is then deposited to electrically insulate the polysilicon gate electrode 66. Contact holes are opened in insulation layer 84 and metal contacts 86 are formed in the contact holes for electrical connection to the source and drain regions of the P and N channel devices. In this same step, metal contact 88 is used to provide an electrical connection to the well contact region 70. A metal such as Al is suitable.

The insulation layer 84 is typically $SiO_2$ having a thickness 2000–4000Å. The final structure is that shown in FIG. 2-15, which is the same as FIG. 1.

FIGS. 3-1 through 3-4

These FIGS. describe an alternative to the process just described, but which also provides the self-aligned field isolation implant. In FIG. 3-1, a P- type semiconductor wafer 90 is provided having thereon a first oxide layer 92, a nitride layer 94, and a second oxide layer 96. These layers are similar in thickness and function to the previously described layers 42, 52, and 54. A layer 98 of resist is located over oxide layer 96, and is used to define a window 100 for the formation of the N- type well 102. To form the well, $P^{31}$ ions are implanted into semiconductor 90, and then a drive-in step is undertaken.

After formation of the well, a layer 104 of silicon, or a silicide, is deposited through the same masking layer 98. Layer 104 has the same function as layer 50 in the previously described embodiment. Resist layer 98 is then removed and a new resist layer 105 is spun onto the structure. Resist layer 105 is patterned to leave an opening for the formation of the field isolation in the same manner that the opening 58 was produced (FIG. 2-6) and utilized. Boron ions are then implanted into semiconductor wafer 90 to form the P+ field isolation implant 106. Implant 106 is self-aligned to the edge of well 102. As is apparent, the edge of silicon layer 104 produces self-alignment between field implant 106 and well 102 because silicon layer 104 was produced through the same mask that was used to define well 102.

Silicon layer 104 is then plasma etched and oxide layer 96 and nitride layer 94 are etched in the window formed by patterned resist 105. This produces the structure of FIG. 3-3 leaving only the thin oxide layer 92 in the window formed by resist layer 105. This structure is similar to the structure of FIG. 2-7, after resist layer 105 is stripped away.

Silicon layer 104 is then removed by plasma etching and thin oxide layer 96 is etched away. During this etching step, thin oxide layer 92 will be etched in those portions unprotected by nitride layer 94. This yields the structure of FIG. 3-4. Nitride layer 94 is used as a mask to define the regions in which the recessed field oxide will be grown. The remainder of the process is the same as that described previously.

The desired doping levels of the various portions of this integrated CMOS structure are generally known in the art. For example, the structure shown in FIG. 1 includes a P- type silicon wafer 12 having a conductivity of $10^{14-15}$ carriers/cm$^3$, source and drain regions (such as 20A, 22A, 20B, and 22B) having conductivities $10^{19-20}$ carriers/cm$^3$, and P- type field isolation implants 34 having a conductivity $10^{16-17}$ carrier/cm$^3$. The conductivity of N- type well 14 is approximately $10^{15-16}$ carriers/cm$^3$. In the practice of this invention, it is possible to provide optimum conductivity levels in the different portions of the integrated structure since separate ion implantation steps are used to form the different doped regions of the structure. This feature is obtained in a process which provides self-alignment of the field isolation implants to the edges of the wells and which requires a minimum number of masking steps. Additionally, the threshold voltages of the N channel devices and P channel devices can be adjusted without requiring a separate masking step.

It will be appreciated by those of skill in the art that changes can be made in this process without altering the invention. For example, the sequence of the first and second masking steps can be reversed. That is, the pattern for the field oxide isolation regions can be formed before forming the pattern for the implanted regions and the wells. However, the actual implantation steps for the well and the field isolation implants will be performed prior to the formation of the recessed oxide regions.

The alternative process steps depicted in FIGS. 3-1 through 3-4 have some advantages in that the nitride deposition does not have to be done twice, which also eliminates the need for two reactive ion etching steps. While this alternative process simplifies part of the overall fabrication, some disadvantages are likely to be introduced. For example, the implanted well 102 (FIG. 3-1) would probably be more shallow because a thicker stack of nitride and oxide is covering the wafer 90 during the implant. Also, the "free" mask (silicon or silicide layer 104) is not left over the well region in the structure of FIG. 3-4, and therefore does not serve as a "free" mask for the N and P channel threshold adjustment implant. In that situation, the oxide and nitride layers 92 and 94, respectively, will serve as the mask for the formation of the recessed oxide isolation regions.

What has been shown is a process for providing an optimum integrated CMOS structure with a minimum number of masking steps wherein self-alignment, high density, and optimum doping levels are provided.

While the invention has been shown with respect to preferred embodiments thereof, it will be apparent to those of skill in the art that variations to this process can be made without departing from the spirit and scope of the invention. For example, the particular ways in which the various regions are formed can be changed. Also, semiconductors other than silicon can be used, and the starting material can have either N or P type conductivity. Also, the other materials can be different than those selected in the preferred embodiments. However, the use of single crystal silicon and its oxides and nitrides, together with a polysilicon gate, provides a fabrication process and product having many advantages.

Having thus described my invention, what I claim as new and desire to secure by Letters Patent is:

1. A method for forming an integrated CMOS structure having P and N channel active devices in a single semiconductor layer of a first conductivity type, wherein electrical isolation is provided by recessed field oxide regions located between said devices and by field isolation implant regions located under some of said field oxide regions, comprising the steps of:

forming a well of opposite conductivity type in said semiconductor layer by ion implantation through a first mask, depositing a masking layer through said first mask onto a substrate including said semiconductor layer, removing said first mask, forming a second mask over said masking layer and said substrate, said second mask having first openings therein through which said field isolation implant regions and said recessed field oxide regions are to be formed said first openings exposing an edge of said masking layer, and second openings therein for determining the locations in said semiconductor layer where said recessed field oxide regions will also be formed, forming said field isolation implant regions in said semiconductor layer by ion implantation through said first openings, said field isolation regions having an opposite conductivity type than the conductivity type of said well, the edge of said masking layer determining the edge of said field isolation regions whereby said field isolation regions are self-aligned to the edge of said well, removing those portions of said masking layer located in said second openings in said second mask, forming said recessed field oxide regions in said semiconductor layer through said openings, and forming said active devices in said semiconductor layer.

2. The method of claim 1, where said field oxide regions outside said well are located over said field isolation implant regions and in contact therewith.

3. The method of claim 2, where the doping level of said field isolation implant regions is independent of the doping level of said well.

4. The method of claim 3, where said semiconductor layer is a layer of silicon, said masking layer is selected from the group consisting of silicon and metal silicides, and said active devices include gate electrodes comprised of doped polysilicon.

5. The method of claim 1, including the additional step of adjusting the threshold voltages of said active devices by ion implantation of said semiconductor layer using said remaining portions of said masking layer has a mask during said implantation to adjust the threshold voltages.

6. The method of claim 5, including the additional steps of removing said remaining portions of said masking layer and further adjusting the threshold voltages of said active devices by ion implantation of said semiconductor layer using said recessed field oxide regions as a mask during said implantation to further adjust the threshold voltages.

7. The method of claim 1, including the further steps of removing said remaining portions of said masking layer and adjusting the threshold voltages of said active devices by ion implantation of said semiconductor layer using said recessed field oxide regions as a mask during said ion implantation to adjust said threshold voltages.

8. The method of claim 1, where said masking layer is a layer of silicon.

9. The method of claim 1, where said masking layer is a layer of metal silicide.

10. The method of claim 1, where said second mask is patterned prior to patterning said first mask.

11. In a process where complementary first and second sets of active devices are to be fabricated in an integrated circuit in a single semiconductor layer, the steps including forming in said semiconductor layer a well having a conductivity type opposite to that of said semiconductor layer, said well being formed in a portion of said semiconductor layer defined by an opening in a first mask, forming a masking layer through said opening in said first mask, forming a buried region of opposite conductivity type to the conductivity type of said well outside said well and self-aligned to an edge of said well using the edge of said masking layer as a mask in the formation of said buried region, patterning said masking layer to provide openings therein, and forming recessed oxide regions over said buried region and in said well using said openings to define the locations where said recessed oxide regions are to be formed.

12. The method of claim 11, wherein said well and said buried region are formed by ion implantation.

13. The method of claim 11, where said semiconductor layer is a layer of silicon and said masking layer is a layer selected from the group consisting of silicon and metal silicides.

14. The method of claim 13, where the conductivity level of said buried regions is independent of the conductivity level of said well.

15. The method of claim 11, including the further step of ion implanting the surface of said semiconductor layer to adjust the threshold voltages of said active devices, said ion implanting being done using said recessed oxide regions as a mask.

16. The method of claim 11, including the additional step of adjusting the threshold voltage of said active devices by ion implantation of said semiconductor layer using said masking layer as a mask during said ion implantation.

17. A method for forming two ion implanted regions in a layer of semiconductor material where said ion implanted regions are self-aligned to one another using two masking steps without critical alignment, comprising the steps of:

forming a first masking level over said semiconductor layer, said masking level including at least one opening therein, ion implanting said semiconductor layer through said opening to produce a first ion implanted region in said semiconductor layer, depositing a masking layer through said opening and onto a substrate including said semiconductor layer, forming a second masking level over said semiconductor and over said masking layer, said second masking level having an opening therein which exposes a portion of said masking layer including an edge thereof, the formation of openings in said second masking level being noncritical in alignment and, ion implanting said semiconductor layer through said opening in said second masking level to produce a second ion implanted region in said semiconductor layer, said second implanted region having an edge determined by said edge of said masking layer, whereby said first and second ion implanted regions have their edges self-aligned with one another.

18. The method of claim 17, where said semiconductor layer is silicon, said first and second masking levels are comprised of patterned resist levels, and said masking layer is selected from the group consisting of silicon and metal silicides.

* * * * *